(12) United States Patent
Lin et al.

(10) Patent No.: US 11,145,335 B2
(45) Date of Patent: Oct. 12, 2021

(54) LATCH-UP PREVENTION CIRCUIT FOR MEMORY STORAGE SYSTEM

(71) Applicant: Taiwan Semiconductor Manufacturing Co., Ltd., Hsinchu (TW)

(72) Inventors: Sungchieh Lin, Zhubei (TW); Kuoyuan (Peter) Hsu, San Jose, CA (US)

(73) Assignee: Taiwan Semiconductor Manufacturing Co., Ltd.

( * ) Notice: Subject to any disclaimer, the term of this patent is extended or adjusted under 35 U.S.C. 154(b) by 0 days.

(21) Appl. No.: 17/135,649

(22) Filed: Dec. 28, 2020

(65) Prior Publication Data
US 2021/0193191 A1    Jun. 24, 2021

Related U.S. Application Data

(60) Division of application No. 16/179,332, filed on Nov. 2, 2018, now Pat. No. 10,878,852, which is a
(Continued)

(51) Int. Cl.
*G11C 5/14* (2006.01)
*G11C 7/22* (2006.01)
*G11C 7/10* (2006.01)

(52) U.S. Cl.
CPC ............ *G11C 5/147* (2013.01); *G11C 7/1078* (2013.01); *G11C 7/22* (2013.01)

(58) Field of Classification Search
CPC ...................................................... G11C 5/14
(Continued)

(56) References Cited

U.S. PATENT DOCUMENTS

| 7,068,024 B1 | 6/2006 | Huang |
| 7,851,947 B2 | 12/2010 | Cassia et al. |

(Continued)

FOREIGN PATENT DOCUMENTS

| CN | 1808323 A | 7/2006 |
| CN | 101325084 A | 12/2008 |

(Continued)

OTHER PUBLICATIONS

Office Action, dated Sep. 25, 2020, for Korean Intellectual Property Office Appl. No. 10-2019-0074033, 7 pages.

*Primary Examiner* — Jason Lappas
(74) *Attorney, Agent, or Firm* — Sterne, Kessler, Goldstein & Fox P.L.L.C.

(57) ABSTRACT

Various embodiments for configurable memory storage systems are disclosed. The configurable memory storages selectively choose an operational voltage signal from among multiple operational voltage signals to dynamically control various operational parameters. For example, the configurable memory storage systems selectively choose a maximum operational voltage signal from among the multiple operational voltage signals to maximize read/write speed. As another example, the configurable memory storage systems selectively choose a minimum operational voltage signal from among the multiple operational voltage signals to minimize power consumption. Moreover, the configurable memory storage systems selectively provide the maximum operational voltage signal to bulk (B) terminals of some of their transistors to prevent latch-up of these transistors. In some situations, the configurable memory storage systems can dynamically adjust the maximum operational voltage signal to compensate for fluctuations in the maximum operational voltage signal.

13 Claims, 7 Drawing Sheets

Related U.S. Application Data continuation-in-part of application No. 16/020,324, filed on Jun. 27, 2018, now abandoned.

(58) Field of Classification Search
USPC .......................................................... 365/156
See application file for complete search history.

(56) References Cited

U.S. PATENT DOCUMENTS

| | | |
|---|---|---|
| 8,174,867 B2 | 5/2012 | Wu |
| 9,225,175 B2 | 12/2015 | Kim |
| 9,570,170 B2 | 2/2017 | Yoon et al. |
| 9,754,663 B1 | 9/2017 | Lee |
| 9,793,916 B2 | 10/2017 | Kim |
| 10,204,906 B2 | 2/2019 | Zhang et al. |
| 10,281,502 B2 | 5/2019 | Kuo et al. |
| 10,503,421 B2 | 12/2019 | Hsu et al. |
| 2004/0004876 A1 | 1/2004 | Choi et al. |
| 2004/0174763 A1 | 9/2004 | Schnepper |
| 2018/0175033 A1* | 6/2018 | Zhang .................. G11C 11/417 |
| 2020/0005834 A1 | 1/2020 | Lin et al. |

FOREIGN PATENT DOCUMENTS

| | | |
|---|---|---|
| CN | 101814321 A | 8/2010 |
| CN | 101826365 A | 9/2010 |
| CN | 105632552 A | 6/2016 |
| CN | 107222197 A | 9/2017 |
| CN | 107785040 A | 3/2018 |
| CN | 108206036 A | 6/2018 |
| CN | 108983867 A | 12/2018 |
| CN | 109215702 A | 1/2019 |
| EP | 1143454 A1 | 10/2001 |
| JP | H09297997 A | 11/1997 |
| KR | 100557643 B1 | 3/2006 |
| KR | 100811273 B1 | 3/2008 |
| KR | 20100082850 A | 7/2010 |
| KR | 20140029060 A | 3/2014 |

* cited by examiner

LATCH-UP PREVENTION CIRCUIT FOR MEMORY STORAGE SYSTEM

CROSS-REFERENCE TO RELATED APPLICATIONS

The present application is a divisional of U.S. patent application Ser. No. 16/179,332, filed Nov. 2, 2018, now U.S. Pat. No. 10,878,852, which is a continuation-in-part of U.S. patent application Ser. No. 16/020,324, filed Jun. 27, 2018, now abandoned, each of which is incorporated herein by reference in its entirety.

BACKGROUND

A memory storage system is an electronic device for reading and/or writing electronic data. The memory storage system includes an array of memory cells which can be implemented as volatile memory cells, such as random-access memory (RAM) cells, which require power to maintain its stored information, or non-volatile memory cells, such as read-only memory (ROM) cells, which can maintain its stored information even when not powered. The electronic data can be read from and/or written into the array of memory cells which can be accessible through various control lines. The two basic operations performed by the memory device are "read," in which the electronic data stored in the array of memory cells is read out, and "write" in which the electronic data is written in the array of memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
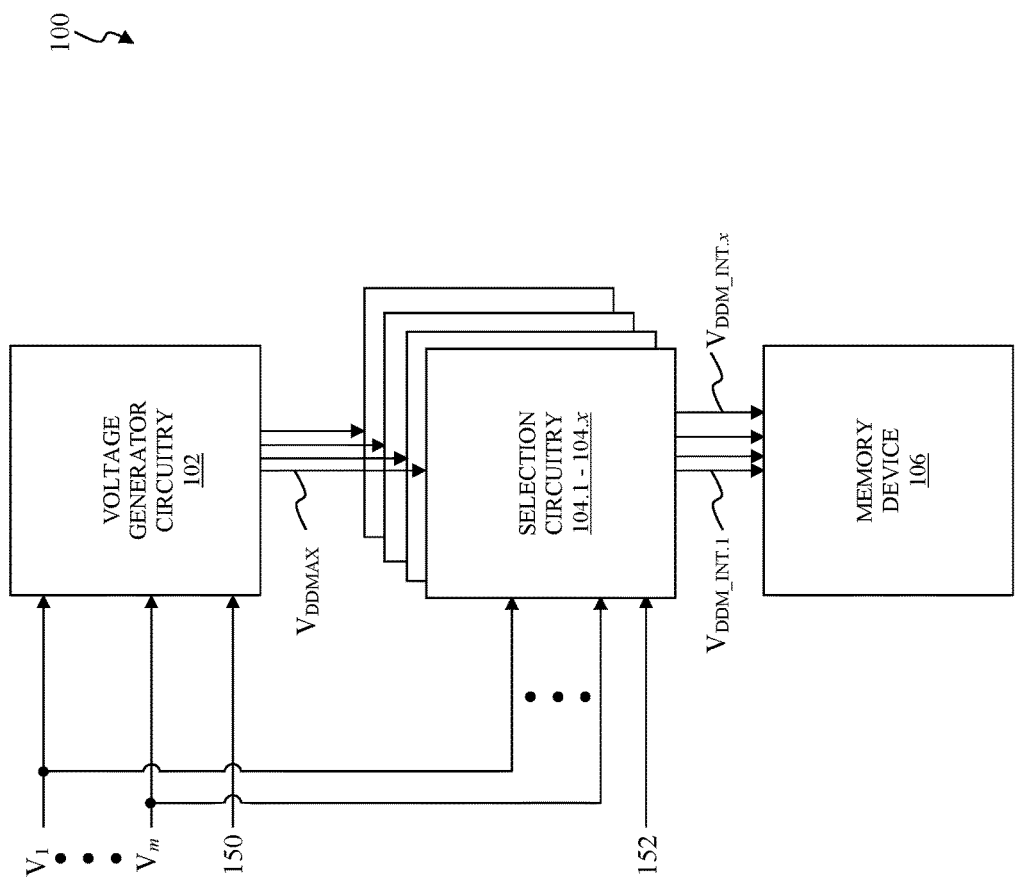
FIG. 1 illustrates a block diagram of an exemplary memory storage system according to an exemplary embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is does not in itself dictate a relationship between the various embodiments and/or configurations described.

Overview

Various embodiments for configurable memory storage systems are disclosed. The configurable memory storages selectively choose an operational voltage signal from among multiple operational voltage signals to dynamically control various operational parameters. For example, the configurable memory storage systems selectively choose a maximum operational voltage signal from among the multiple operational voltage signals to maximize read/write speed. As another example, the configurable memory storage systems selectively choose a minimum operational voltage signal from among the multiple operational voltage signals to minimize power consumption. Moreover, the configurable memory storage systems selectively provide the maximum operational voltage signal to bulk (B) terminals of some of their transistors to prevent latch-up of these transistors. In some situations, the configurable memory storage systems can dynamically adjust the maximum operational voltage signal to compensate for fluctuations in the maximum operational voltage signal.

Exemplary Memory Storage System

FIG. 1 illustrates a block diagram of an exemplary memory storage system according to an exemplary embodiment of the present disclosure. In the exemplary embodiment illustrated in FIG. 1, a memory storage system 100 selectively chooses between multiple operational voltage signals to dynamically control operation. For example, the memory storage system 100 can select an operational voltage signal from among the multiple operational voltage signals to configure the memory storage system 100 to dynamically control, for example, minimize or maximize, one or more operational parameters, such as power consumption and/or read/write speed, from among multiple operational parameters of the memory storage system 100. As illustrated in FIG. 1, the memory storage system 100 includes voltage generator circuitry 102, selection circuitry 104.1 through 104.x, and a memory device 106.

The voltage generator circuitry 102 selectively provides a maximum operational voltage signal $V_{DDMAX}$ from among the operational voltage signals $V_1$ through $V_m$ to the selection circuitry 104.1 through 104.x in accordance with a biasing control signal 150. For example, the maximum operational voltage signal $V_{DDMAX}$ can represent the greatest operational voltage signal from among the operational voltage signals $V_1$ through $V_m$. In some situations, the greatest operational voltage signal from among the operational voltage signals $V_1$ through $V_m$ is a priori known. In an exemplary embodiment, the voltage generator circuitry 102 includes multiple switches to selectively provide the greatest operational voltage signal from among the operational voltage signals $V_1$ through $V_m$ as the maximum operational voltage signal $V_{DDMAX}$. In this exemplary embodiment, the biasing control signal 150 includes one or more control bits in which various combinations of the one or more control bits correspond to various operational voltage signals from among the operational voltage signals $V_1$ through $V_m$. In this exemplary embodiment, the biasing control signal 150 can be set to a combination of control bits corresponding to the greatest operational voltage signal from among the operational voltage signals $V_1$ through $V_m$ to configure the voltage generator circuitry 102 to selectively provide the greatest operational voltage signal from among the operational voltage signals $V_1$ through $V_m$ as the maximum operational voltage signal $V_{DDMAX}$ to the selection circuitry 104.1 through 104.x. In this exemplary embodiment, this combination of the control bits activates, namely, closes, one or more switches from among the multiple switches to provide the greatest operational voltage signal from among the operational voltage signals $V_1$ through $V_m$ as the maximum operational voltage signal $V_{DDMAX}$ while remaining switches from among the multiple switches are deactivated, namely, open.

In the exemplary embodiment illustrated in FIG. 1, the selection circuitry 104.1 through 104.x selectively provides one of the operational voltage signals $V_1$ through $V_m$ as operational voltage signals $V_{DDM\_INT.1}$ through $V_{DDM\_INT.x}$ in response to a selection control signal 152 to control the one or more operational parameters of the memory device 106. The selection control signal 152 can be set to various combinations of one or more control bits to selectively provide one of the operational voltage signals $V_1$ through $V_m$ as the operational voltage signals $V_{DDM\_INT.1}$ through $V_{DDM\_INT.x}$ to dynamically control the multiple operational parameters of the memory device 106. For example, the one or more control bits can be set to a first combination of bits to select a minimum operational voltage signal from among the operational voltage signals $V_1$ through $V_m$ to dynamically control, for example, minimize, the power consumption of the memory device 106. In this example, the minimum operational voltage signal causes less unwanted leakage among the various transistors of the memory device 106 when compared to other operational voltage signals from among the operational voltage signals $V_1$ through $V_m$. As another example, the one or more control bits can be set to a second combination of bits to select a maximum operational voltage signal from among the operational voltage signals $V_1$ through $V_m$ to dynamically control, for example, maximize, the read/write speed of the memory device 106. In some situations, the selection control signal 152 can be switched during operation of the memory storage system 100 to dynamically configure the memory device 106 on the fly to control the one or more operational parameters. In this other example, the maximum operational voltage signal can cause various transistors of the memory cells of the memory device 106 to turn off and/or on at faster rate when compared to other operational voltage signals from among the operational voltage signals $V_1$ through $V_m$. As a further example, the selection control signal 152 can be set to the second combination of bits to maximize the read/write speed of the memory device 106 and be dynamically re-configured on the fly to a different combination of bits to reduce the read/write speed of the memory device 106.

In an exemplary embodiment, the selection circuitry 104.1 through 104.x includes multiple switches to selectively provide one of the operational voltage signals $V_1$ through $V_m$ as operational voltage signals $V_{DDM\_INT.1}$ through $V_{DDM\_INT.x}$. In this exemplary embodiment, the selection control signal 152 includes one or more control bits in which various combinations of the one or more control bits correspond to various operational voltage signals from among the operational voltage signals $V_1$ through $V_m$. In this exemplary embodiment, the selection control signal 152 can be set to a combination of control bits corresponding to the greatest operational voltage signal from among the operational voltage signals $V_1$ through $V_m$ to configure the selection circuitry 104.1 through 104.x to selectively provide the greatest operational voltage signal from among the operational voltage signals $V_1$ through $V_m$ as the operational voltage signals $V_1$ through $V_m$ as the operational voltage signals $V_{DDM\_INT.1}$ through $V_{DDM\_INT.x}$ to the memory device 106. In this exemplary embodiment, this combination of the control bits activates, namely, closes, one or more switches from among the multiple switches to provide the greatest operational voltage signal from among the operational voltage signals $V_1$ through $V_m$ as the maximum operational voltage signal $V_{DDMAX}$ while remaining switches from among the multiple switches are deactivated, namely, open. In this exemplary embodiment, the multiple switches can be implemented using transistors, such as p-type metal-oxide-semiconductor (PMOS) transistors, having source, drain, gate, and bulk (B) terminals formed within well regions of semiconductor substrate. As to be described in further detail below, the selection circuitry 104.1 through 104.x provide the maximum operational voltage signal $V_{DDMAX}$ from the voltage generator circuitry 102 to the bulk (B) terminals of the transistors to cause parasitic diodes, formed between the source (S) terminals and the well regions of these transistors, to be reversed biased, namely, non-conducting, to prevent latch-up of these transistors. In some situations, the maximum operational voltage signal $V_{DDMAX}$ can fluctuate, for example, in response to unwanted electromagnetic coupling and/or leakage between the well regions of the transistors and the semiconductor substrate. In these situations, the selection circuitry 104.1 through 104.x can dynamically adjust the maximum operational voltage signal $V_{DDMAX}$ to compensate for these fluctuations in the maximum operational voltage signal $V_{DDMAX}$ as to be discussed in further detail below.

The memory device 106 receives the operational voltage signals $V_{DDM\_INT.1}$ through $V_{DDM\_INT.x}$ selectively chosen from among the operational voltage signals $V_1$ through $V_m$. In the exemplary embodiment illustrated in FIG. 1, the memory device 106 includes memory cells that are arranged into an array of m columns and n rows. In this exemplary embodiment, the memory device 106 provides each of the operational voltage signals $V_{DDM\_INT.1}$ through $V_{DDM\_INT.x}$ to a corresponding column from among the m columns of the memory array as to be discussed in further detail below in FIG. 2A and/or to a corresponding row from among the n rows of the array of memory cells as to be discussed in further detail below in FIG. 2B.

Figure 2A:
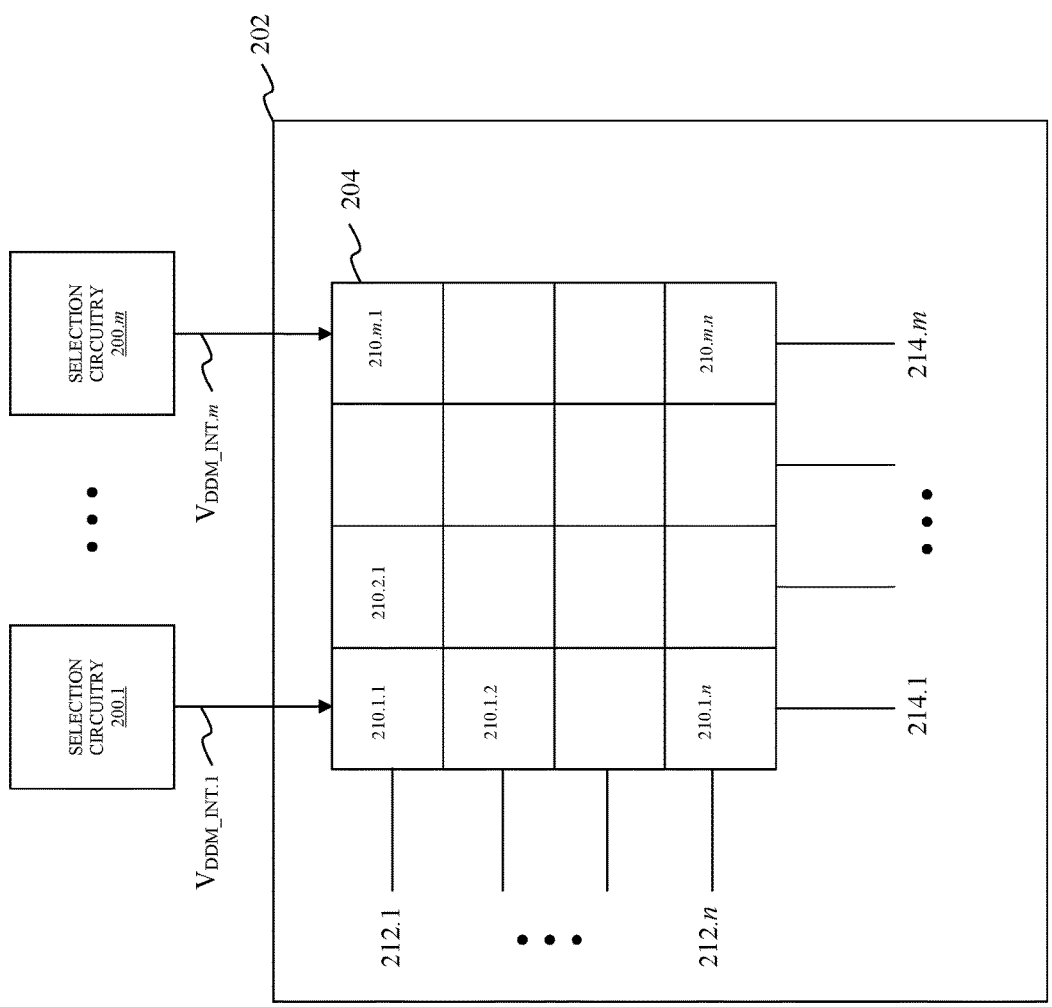
FIG. 2A illustrates a block diagram of a first exemplary memory device that can be implemented within the exemplary memory storage system according to an exemplary embodiment of the present disclosure.

Exemplary Memory Devices that can be Implemented within the Exemplary Memory Storage System FIG. 2A illustrates a block diagram of a first exemplary memory device that can be implemented within the exemplary memory storage system according to an exemplary embodiment of the present disclosure. In the exemplary embodiment illustrated in FIG. 2A, selection circuitry 200.1 through 200.m selectively provides the operational voltage signals $V_{DDM\_INT.1}$ through $V_{DDM\_INT.m}$ to configure operation of a memory device 202 in a substantially similar manner as the selection circuitry 104.1 through 104.x as described above in FIG. 1. The memory device 202 can represent an exemplary embodiment of the memory device 106 as described above in FIG. 1. In an exemplary embodiment, the selection circuitry 200.1 through 200.m selectively provides a first operational voltage signal from among the multiple operational voltage signals as the operational voltage signals $V_{DDM\_INT.1}$ through $V_{DDM\_INT.m}$ to configure the memory device 202 to dynamically control, for example, minimize, one or more operational parameters, such as power consumption and/or read/write speed, from among multiple operational parameters of the memory device 202. As another example, the selection circuitry 200.1 through 200.m selectively provides a second operational voltage signal from among the multiple operational voltage signals to configure the memory device 202 to dynamically control, for example, maximize, the one or more operational parameters of the memory device 202.

In the exemplary embodiment illustrated in FIG. 2A, the memory device 202 includes a memory array 204. Although not illustrated in FIG. 2A, the memory device 202 can include other electronic circuitry, such as a sense amplifier, a row-address decoder and/or a column-address decoder to provide some examples, which will be apparent to those skilled in the relevant art(s) without departing from the spirit and scope of the present disclosure. As illustrated in FIG. 2A, the memory array 204 includes memory cells 210.1.1 through 210.m.n that are configured and arranged into an array of m columns and n rows. However, other arrangements for the memory cells 210.1.1 through 210.m.n are possible without departing from the spirit and scope of the present disclosure. In the exemplary embodiment illustrated in FIG. 2A, the memory cells 210.1.1 through 210.m.n are connected to corresponding wordlines (WLs) from among WLs 212.1 through 212.n and corresponding bitlines (BLs) from among BLs 214.1 through 214.m. The WLs 212.1 through 212.n and/or the BLs 214.1 through 214.m can be used to read electronic data stored in the memory array 204 in a "read" mode of operation and/or to write electronic data in the memory array 204 in a "write" mode of operation. The "read" mode of operation and the "write" mode of operation represent conventional reading and writing operations and will not be described in further detail.

As illustrated in FIG. 2A, the selection circuitry 200.1 through 200.m selectively provides the operational voltage signals $V_{DDM\_INT.1}$ through $V_{DDM\_INT.m}$ to one or more corresponding columns from among the m columns of the memory cells 210.1.1 through 210.m.n. For example, the selection circuitry 200.1 selectively provides the operational voltage signal $V_{DDM\_INT.1}$ to a first column of memory cells 210.1.1 through 210.1.n and the selection circuitry 200.m selectively provides the operational voltage signal $V_{DDM\_INT.m}$ to an $m^{th}$ column of memory cells 210.m.1 through 210.m.n. Although not illustrated in FIG. 2A, each of the selection circuitry 200.1 through 200.m can selectively provide its corresponding operational voltage signal from among the operational voltage signals $V_{DDM\_INT.1}$ through $V_{DDM\_INT.m}$ to more than one column from among the m columns of the memory cells 210.1.1 through 210.m.n. In an exemplary embodiment, the memory cells 210.m.1 through 210.m.n can be implemented using one or more transistors, such as one or more p-type metal-oxide-semiconductor (PMOS) transistors, one or more n-type metal-oxide-semiconductor (NMOS) transistors, or any combination of PMOS transistors and NMOS transistors that will be apparent to those skilled in the relevant art(s) without departing from the spirit and scope of the present disclosure. In this exemplary embodiment, the selection circuitry 200.1 through 200.m can selectively provide the operational voltage signals $V_{DDM\_INT.1}$ through $V_{DDM\_INT.m}$ to bulk (B) terminals of transistors within their corresponding columns from among the m columns of the memory cells 210.1.1 through 210.m.n. The operational voltage signals $V_{DDM\_INT.1}$ through $V_{DDM\_INT.m}$ effectively cause parasitic diodes, formed between source (S) terminals and well regions of these transistors to provide an example, to be reversed biased, namely, non-conducting, to prevent latch-up of these transistors as to be discussed in further detail below in FIG. 3.

Figure 2B:
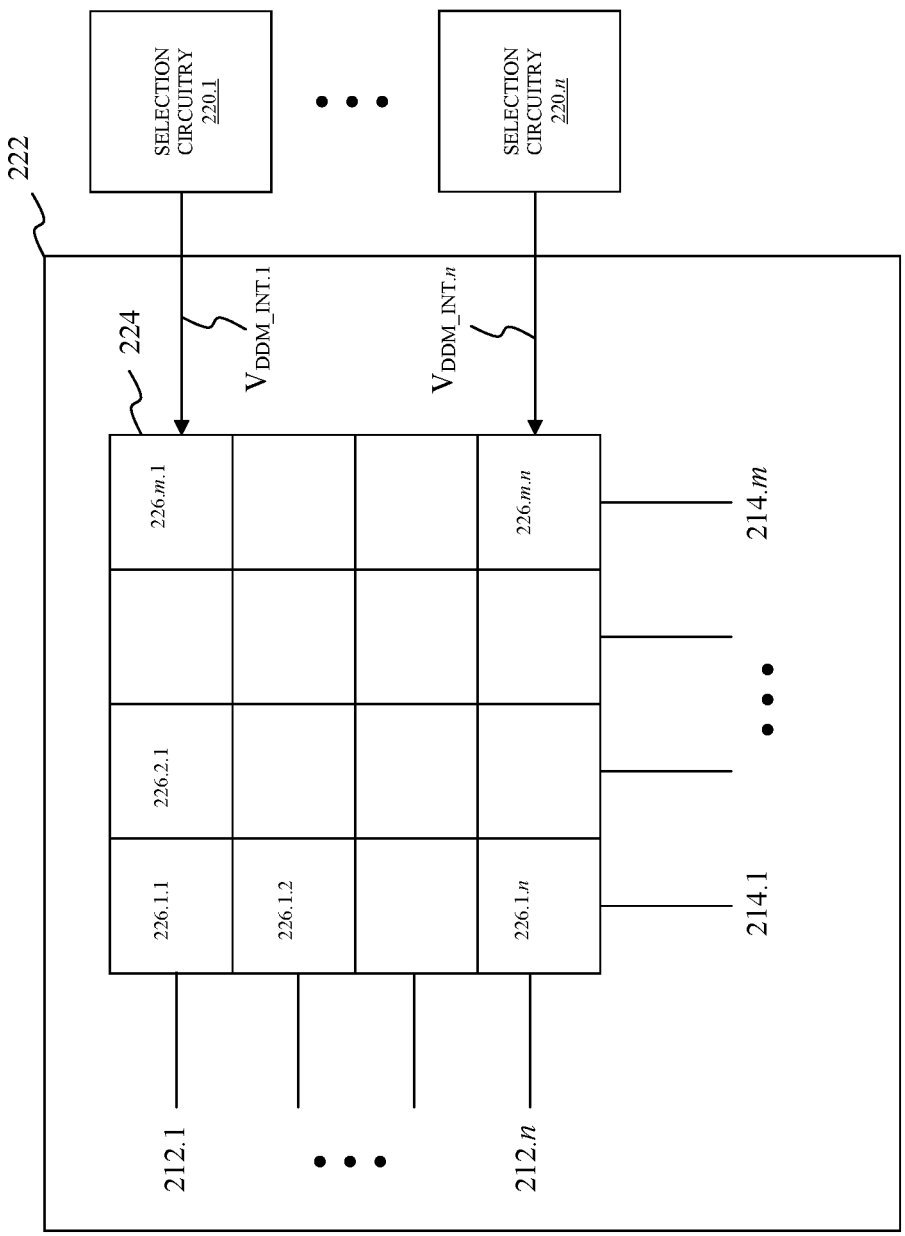
FIG. 2B illustrates a block diagram of a second exemplary memory device that can be implemented within the exemplary memory storage system according to an exemplary embodiment of the present disclosure.

FIG. 2B illustrates a block diagram of a second exemplary memory device that can be implemented within the exemplary memory storage system according to an exemplary embodiment of the present disclosure. In the exemplary embodiment illustrated in FIG. 2B, selection circuitry 220.1 through 220.n selectively provides the operational voltage signals $V_{DDM\_INT.1}$ through $V_{DDM\_INT.n}$ to configure operation of a memory device 222 in a substantially similar manner as the selection circuitry 104.1 through 104.x as described above in FIG. 1. The memory device 222 can represent an exemplary embodiment of the memory device 106 as described above in FIG. 1. In an exemplary embodiment, the selection circuitry 220.1 through 220.n selectively provides a first operational voltage signal from among the multiple operational voltage signals as the operational voltage signals $V_{DDM\_INT.1}$ through $V_{DDM\_INT.n}$ to configure the memory device 222 to dynamically control, for example, minimize, one or more operational parameters, such as power consumption and/or read/write speed, from among multiple operational parameters of the memory device 222. As another example, the selection circuitry 220.1 through 220.n selectively provides a second operational voltage signal from among the multiple operational voltage signals to configure the memory device 222 to dynamically control, for example, maximize, the one or more operational parameters of the memory device 222.

In the exemplary embodiment illustrated in FIG. 2B, the memory device 222 includes a memory array 224. Although not illustrated in FIG. 2B, the memory device 222 can include other electronic circuitry, such as a sense amplifier, a row-address decoder and/or a column-address decoder to provide some examples, which will be apparent to those skilled in the relevant art(s) without departing from the spirit and scope of the present disclosure. As illustrated in FIG. 2B, the memory array 224 includes memory cells 226.1.1 through 226.m.n that are configured and arranged into an array of m columns and n rows. However, other arrangements for the memory cells 226.1.1 through 226.m.n are possible without departing from the spirit and scope of the present disclosure. In the exemplary embodiment illustrated in FIG. 2B, the memory cells 226.1.1 through 226.m.n are connected to corresponding wordlines (WLs) from among the WLs 212.1 through 212.n and corresponding bitlines (BLs) from among the BLs 214.1 through 214.m.

As illustrated in FIG. 2B, the selection circuitry 220.1 through 220.m selectively provides the operational voltage signals $V_{DDM\_INT.1}$ through $V_{DDM\_INT.n}$ to one or more corresponding rows from among the n rows of the memory cells 226.1.1 through 226.m.n. For example, the selection circuitry 220.1 selectively provides the operational voltage signal $V_{DDM\_INT.1}$ to a first row of memory cells 226.1.1 through 226.m.1 and the selection circuitry 220.n selectively provides the operational voltage signal $V_{DDM\_INT.n}$ to an $n^{th}$ row of memory cells 226.1.n through 226.m.n. Although not illustrated in FIG. 2B, each of the selection circuitry 220.1 through 220.m can selectively provide its corresponding operational voltage signal from among the operational voltage signals $V_{DDM\_INT.1}$ through $V_{DDM\_INT.n}$ to more than one row from among the n rows of the memory cells 226.1.1 through 226.m.n. In an exemplary embodiment, the memory cells 226.m.1 through 226.m.n can be implemented using one or more transistors, such as one or more p-type metal-oxide-semiconductor (PMOS) transistors, one or more n-type metal-oxide-semiconductor (NMOS) transistors, or any combination of PMOS transistors and NMOS transistors that will be apparent to those skilled in the relevant art(s) without departing from the spirit and scope of the present disclosure. In this exemplary embodiment, the selection circuitry 220.1 through 220.n can selectively provide the operational voltage signals $V_{DDM\_INT.1}$ through $V_{DDM\_INT.n}$ to bulk (B) terminals of transistors within their corresponding columns from among the m columns of the memory cells 226.1.1 through 226.m.n. The operational voltage signals $V_{DDM\_INT.1}$ through $V_{DDM\_INT.n}$ effectively cause parasitic diodes, formed between source (S) terminals and well regions of these transistors to provide an example, to be reversed biased, namely, non-conducting, to prevent latch-up of these transistors as to be discussed in further detail below in FIG. 3.

Exemplary Memory Cells that can be Implemented within the Exemplary Memory Devices As described above in FIG. 1, FIG. 2A, and FIG. 2B, the exemplary memory device described therein, such as the memory device 106 as described above in FIG. 1, the memory device 202 as described above in FIG. 2A, and/or the memory device 222 as described above in FIG. 2B to provide some examples, include an array of memory cells, such as the memory cells 210.1.1 through 210.m.n as described above in FIG. 2A and/or the memory cells 226.1.1 through 226.m.n as described above in FIG. 2B to provide some examples. The discussion of FIG. 3 to follow describes various embodiments for these memory cells. However, those skilled in the relevant art(s) will recognize the teachings of the various embodiments for these memory cells to be described below can be readily modified for any suitable volatile memory cell, such as any random-access memory (RAM) cell and/or any suitable non-volatile memory cell, such any read-only memory (ROM) cell, without departing from the spirit and scope of the present disclosure. The RAM cells can be implemented as dynamic random-access memory (DRAM) cells, static random-access memory (SRAM) cells, and/or non-volatile random-access memory (NVRAM) cells, such as flash memory cells to provide an example. The ROM cells can be implemented as a programmable read-only memory (PROM) cells, one-time programmable (OTP) ROM cells, erasable programmable read-only memory (EPROM) cells, and/or an electrically erasable programmable read-only memory (EEPROM) cells to provide some examples.

Figure 3:
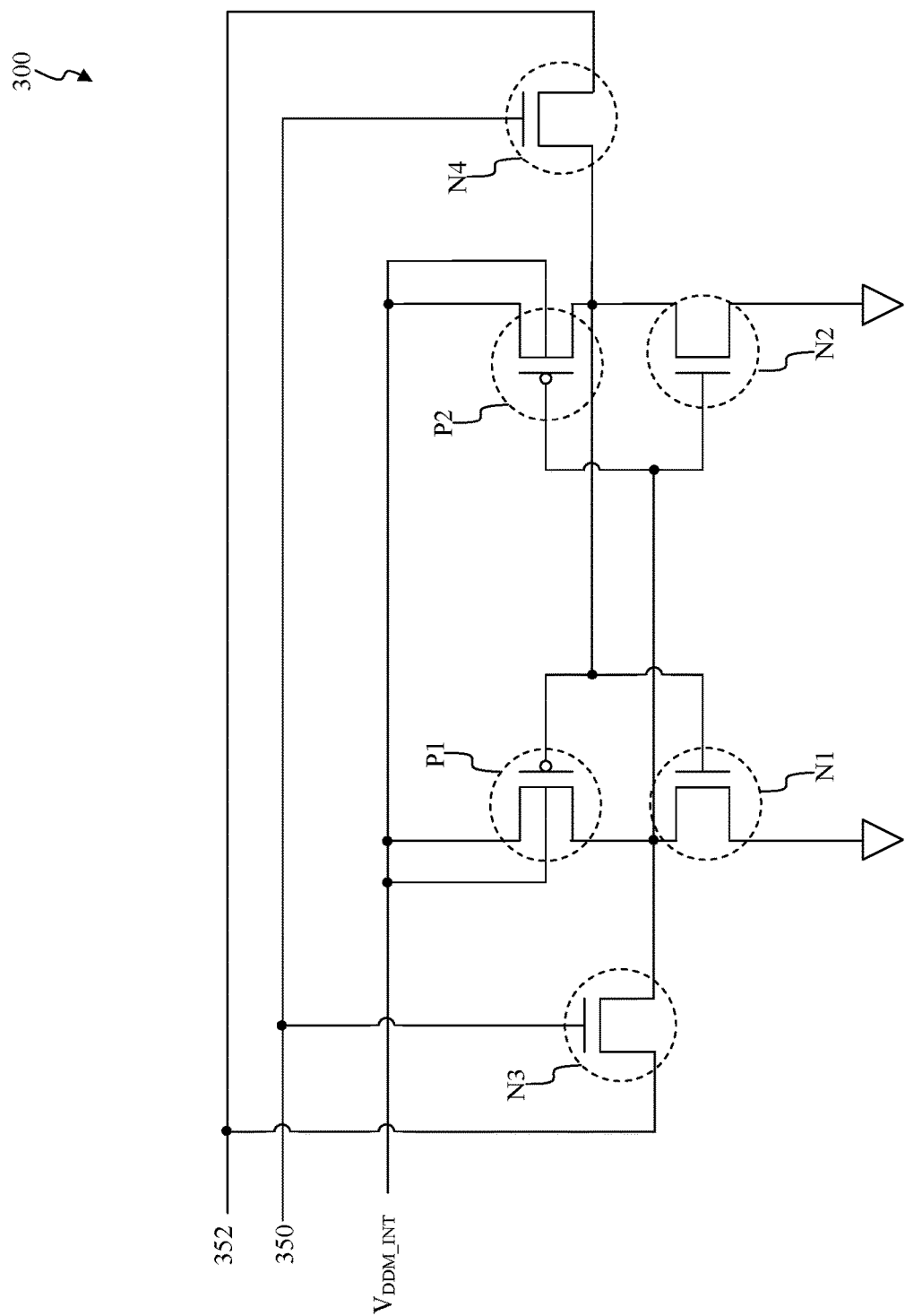
FIG. 3 illustrates a block diagram of an exemplary static random-access memory (SRAM) cell that can be implemented within the exemplary memory device according to an exemplary embodiment of the present disclosure.

FIG. 3 illustrates a block diagram of an exemplary static random-access memory (SRAM) cell that can be implemented within the exemplary memory device according to an exemplary embodiment of the present disclosure. In the exemplary embodiment illustrated in FIG. 3, an SRAM cell 300 can be used to implement one or more memory cells of the memory device 106 as described above in FIG. 1, one or more of the memory cells 210.1.1 through 210.m.n of the memory device 202 as described above in FIG. 2A, and/or one or more of the memory cells 226.1.1 through 226.m.n of the memory device 222 as described above in FIG. 2B. As illustrated in FIG. 3, the SRAM cell 300 includes p-type metal-oxide-semiconductor (PMOS) transistors P1 and P2 and n-type metal-oxide-semiconductor (NMOS) transistors N1 through N4.

In the exemplary embodiment illustrated in FIG. 3, the PMOS transistor P1 and the NMOS transistor N1 are arranged to form a first logical INVERTER gate and the PMOS transistor P2 and the NMOS transistor N2 are arranged to form a second logical INVERTER gate. The first logical INVERTER gate is cross-coupled with the second logical INVERTER gate as illustrated in FIG. 3. For example, an input of the first logical INVERTER gate being coupled to an output of the second logical INVERTER gate and an output of the first logical INVERTER gate being coupled to an input of the second logical INVERTER gate. In this cross-coupled configuration, the first logical INVERTER and the second logical INVERTER functionally cooperate to reinforce information stored in the SRAM cell 300.

In the exemplary embodiment illustrated in FIG. 3, the information stored within the first logical INVERTER gate and the second logical INVERTER gate cyclically transitions between a logical zero and a logical one, such as an operational voltage signal $V_{DDM\_INT}$. In an exemplary embodiment, the operational voltage signal $V_{DDM\_INT}$ represents an exemplary embodiment of one of the operational voltage signals $V_{DDM\_INT.1}$ through $V_{DDM\_INT.x}$ as described above in FIG. 1, one of the operational voltage signals $V_{DDM\_INT.1}$ through $V_{DDM\_INT.m}$ as described above in FIG. 2A, and/or one of the operational voltage signals $V_{DDM\_INT.1}$ through $V_{DDM\_INT.n}$ as described above in FIG. 2B. In another exemplary embodiment, the first logical INVERTER and the second logical INVERTER receive the operational voltage signal $V_{DDM\_INT}$ from selection circuitry, such as one of the selection circuitry 104.1 through 104.x as described above in FIG. 1, one of the selection circuitry 200.1 through 200.m as described above in FIG. 2A, and/or one of the selection circuitry 220.1 through 220.n as described above in FIG. 2B to provide some examples.

During a "read" operation, the NMOS transistor N3 and the NMOS transistor N4 are activated by asserting a word-line (WL) 350. This activation of the NMOS transistor N3 and the NMOS transistor N4 couples the first logical INVERTER and the second logical INVERTER to a bitline (BL) 352. In an exemplary embodiment, the WL 350 can represent one of the WLs 212.1 through 212.n as described above in FIG. 2A and FIG. 2B and the BL 352 can represent one of the BLs 214.1 through 214.m as described above in FIG. 2A and FIG. 2B. Thereafter, the information stored within the first logical INVERTER and the second logical INVERTER passes onto the bitline (BL) 352. Similarly, during a "write" operation, the NMOS transistor N3 and the NMOS transistor N4 are activated by asserting the WL 350 to couple the first logical INVERTER and the second logical INVERTER to the BL 352. Thereafter, a state of the BL 352 passes onto the first logical INVERTER and the second logical INVERTER to be stored as the information within the first logical INVERTER and the second logical INVERTER.

Moreover, as illustrated in FIG. 3, the operational voltage signal $V_{DDM\_INT}$ is coupled to a first bulk (B) terminal of the PMOS transistor P1 and a second bulk (B) terminal of the PMOS transistor P2. In the exemplary embodiment illustrated in FIG. 3, the PMOS transistor P1 is situated within a first n-well region within a p-type semiconductor substrate and the PMOS transistor P2 is situated within a second n-well region within the p-type semiconductor substrate. In this exemplary embodiment, the operational voltage signal $V_{DDM\_INT}$ transfers charge from the bulk (B) terminal of the PMOS transistor P1 and the bulk (B) terminal of the PMOS transistor P2 to the first n-well region and the second n-well region, respectively.

Exemplary Selection Circuitry within the Exemplary Memory Storage System

As described above in FIG. 1, the selection circuitry 104.1 through 104.x selectively provides one of the operational voltage signals $V_1$ through $V_m$ as the operational voltage signals $V_{DDM\_INT.1}$ through $V_{DDM\_INT.x}$ to control the one or more operational parameters of the memory device 106. The discussion of FIG. 4 to follow describes an exemplary embodiment for one of the selection circuitry 104.1 through 104.x.

Figure 4:
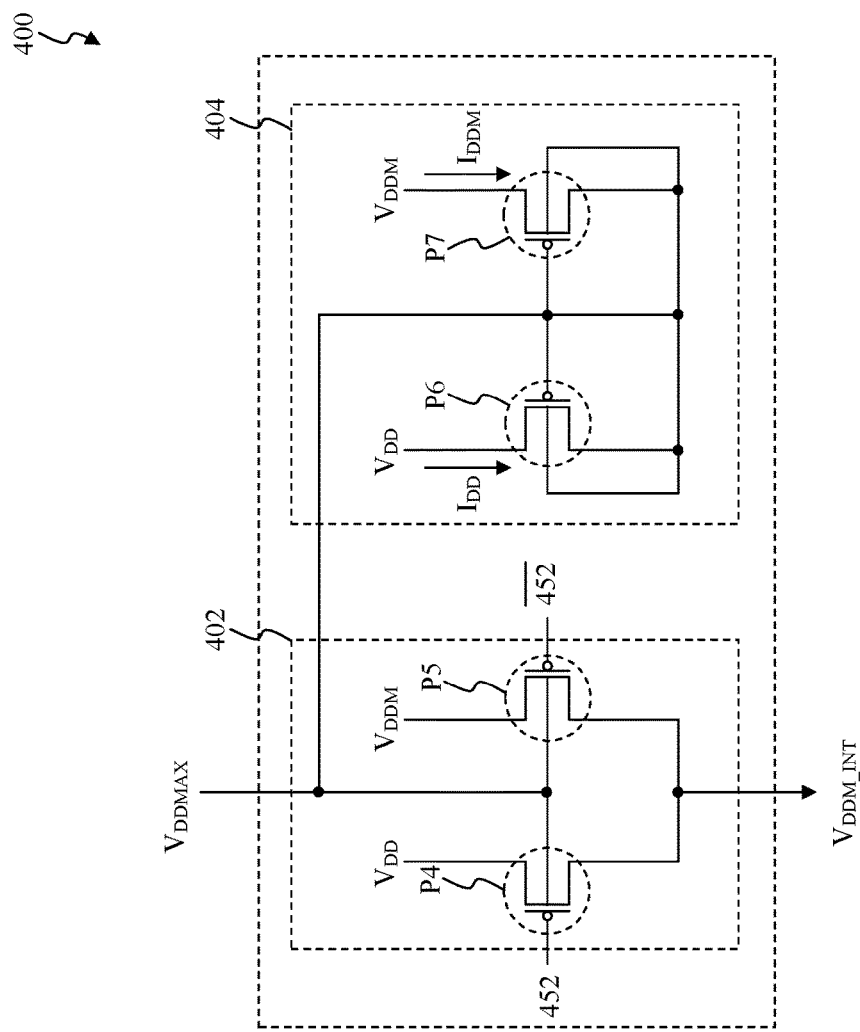
FIG. 4 illustrates a block diagram of an exemplary selection circuitry that can be implemented within the exemplary memory device according to an exemplary embodiment of the present disclosure.

FIG. 4 illustrates a block diagram of an exemplary selection circuitry that can be implemented within the exemplary memory device according to an exemplary embodiment of the present disclosure. In the exemplary embodiment illustrated in FIG. 4, the selection circuitry 400 selectively provides an operational voltage signal $V_{DDM\_INT}$ from among an operational voltage signal $V_{DD}$ and an operational voltage signal $V_{DDM}$ to control one or more operational parameters of a memory device, such as the memory device 106 to provide an example. In an exemplary embodiment, the operational voltage signals $V_{DDM}$ and $V_{DD}$ can represent exemplary embodiments of two of the operational voltage signals $V_1$ through $V_m$ as described above in FIG. 1. In another exemplary embodiment, the operational voltage signal $V_{DD}$ corresponds to an operational voltage signal which is allocated to other digital circuitry communicatively coupled to the memory device and the operational voltage signal $V_{DDM}$ corresponds to an operational voltage signal which is allocated to the memory device. In some situations, the operational voltage signal $V_{DD}$ is greater than the operational voltage signal $V_{DDM}$; however, in other situations, the operational voltage signal $V_{DD}$ can be less than the operational voltage signal $V_{DDM}$. In the exemplary embodiment illustrated in FIG. 4, the selection circuitry 400 selects a greater one of the operational voltage signals $V_{DDM}$ and $V_{DD}$ as the operational voltage signal $V_{DDM\_INT}$ to maximize a read/write speed of a corresponding column, as described above in FIG. 2A, as and/or a corresponding row, as described above in FIG. 2B, of memory cells of the memory device 106. Otherwise, the selection circuitry 400 selects a lesser one of the operational voltage signals $V_{DDM}$ and $V_{DD}$ as the operational voltage signal $V_{DDM\_INT}$ to minimize a power consumption of the corresponding column and/or the corresponding row of memory cells of the memory device 106.

Moreover, as to be discussed in further detail below, the selection circuitry 400 includes multiple switches to selectively provide the operational voltage signal $V_{DD}$ or the operational voltage signal $V_{DDM}$ as the operational voltage signal $V_{DDM\_INT}$. And as to be discussed in further detail below, the selection circuitry 400 provides the maximum operational voltage signal $V_{DDMAX}$ to the bulk (B) terminals of transistors of the multiple switches to cause parasitic diodes, formed between the source (S) terminals and the well regions of these transistors, to be reversed biased, namely, non-conducting, to prevent latch-up of these transistors. In some situations, the maximum operational voltage signal $V_{DDMAX}$ can fluctuate, for example, in response to unwanted electromagnetic coupling and/or leakage between the well regions of the transistors and the semiconductor substrate. In these situations, selection circuitry 400 can dynamically adjust the maximum operational voltage signal $V_{DDMAX}$ to compensate for these fluctuations in the maximum operational voltage signal $V_{DDMAX}$ as to be discussed in further detail below. In the exemplary embodiment illustrated in FIG. 4, the selection circuitry 400 includes a switching circuit 402 and a latch-up prevention circuit 404.

In the exemplary embodiment illustrated in FIG. 4, the switching circuit 402 selectively provides the operational voltage signal $V_{DDM\_INT}$ from among the operational voltage signal $V_{DD}$ and the operational voltage signal $V_{DDM}$ to control the one or more operational parameters of the memory device. As illustrated in FIG. 4, the switching circuit 402 includes p-type metal-oxide-semiconductor (PMOS) transistors P4 and P5. As illustrated in FIG. 4, the PMOS transistors P4 and P5 selectively provide their corresponding operational voltage signals $V_{DDM}$ and $V_{DD}$ as the operational voltage signal $V_{DDM\_INT}$. In an exemplary embodiment, a biasing control signal 452 and a biasing control signal $\overline{452}$ activate, namely, close, a first transistor from among the PMOS transistors P4 and P5 when at a first logical level, such as a logical zero to provide an example, and/or deactivate, namely, open, a second transistor from among the PMOS transistors P4 and P5 when at a second logical level, such as a logical one to provide an example. In this exemplary embodiment, the biasing control signal 452 and the biasing control signal $\overline{452}$ represent a differential biasing control signal with the biasing control signal 452 being a complement of the biasing control signal $\overline{452}$. In this exemplary embodiment, the PMOS transistors P4 and P5, when activated, selectively provide their corresponding operational voltage signals $V_{DDM}$ and $V_{DD}$ as the operational voltage signal $V_{DDM\_INT}$. Also, in this exemplary embodiment, the PMOS transistors P4 and P5, when deactivated, are selectively prohibited from providing their corresponding operational voltage signals $V_{DDM}$ and $V_{DD}$. Furthermore, the PMOS transistors P4 and P5 as illustrated in FIG. 4 can be implemented having source (S), drain (D), gate (G), and bulk (B) terminals. As illustrated in FIG. 4, the source (S), the drain (D), and the bulk (B) terminals are formed within well regions of semiconductor substrate. In the exemplary embodiment illustrated in FIG. 4, the switching circuit 402 can provide the maximum operational voltage signal $V_{DDMAX}$ to the bulk (B) terminals of the PMOS transistors P4 and P5 to cause parasitic diodes, formed between the source (S) terminals and the n-well regions of the PMOS transistors P4 and P5, to be reversed biased, namely, non-conducting, to prevent latch-up of the PMOS transistors P4 and P5.

In the exemplary embodiment illustrated in FIG. 4, the latch-up prevention circuit 404 can dynamically adjust the maximum operational voltage signal $V_{DDMAX}$ to compensate for fluctuations in the maximum operational voltage signal $V_{DDMAX}$. These fluctuations can be caused by unwanted electromagnetic coupling and/or leakage between various regions of various transistors. As illustrated in FIG. 4, the latch-up prevention circuit 404 includes p-type metal-oxide-semiconductor (PMOS) transistors P6 and P7. In the exemplary embodiment illustrated in FIG. 4, the PMOS transistors P6 and P7 represent diode connected transistors having their respective source (S) terminals coupled to their respective gate (G) terminals. During operation, the maximum operational voltage signal $V_{DDMAX}$ is typically greater than or equal to the operational voltage signals $V_{DDM}$ and $V_{DD}$. However, in some situations, the fluctuations in the maximum operational voltage signal $V_{DDMAX}$ can cause the maximum operational voltage signal $V_{DDMAX}$ to be less than the operational voltage signals $V_{DDM}$ and $V_{DD}$. In these situations, the PMOS transistors P6 and P7 can activate, namely, close, as to be described in further detail below in FIG. 5. The PMOS transistor P6, when activated, sources a current $I_{DD}$ from the operational voltage signal $V_{DD}$ to adjust, namely increase, the maximum operational voltage signal $V_{DDMAX}$. Similarly, the PMOS transistor P7, when activated, sources a current $I_{DDM}$ from the operational voltage signal $V_{DDM}$ to adjust, namely increase, the maximum operational voltage signal $V_{DDMAX}$. This adjustment of the maximum operational voltage signal $V_{DDMAX}$ by the latch-up prevention circuit 404 ensures the maximum operational voltage signal $V_{DDMAX}$ is sufficient to prevent latch-up of the transistors P4 and P5 as to be described in further detail below in FIG. 5.

Figure 5:
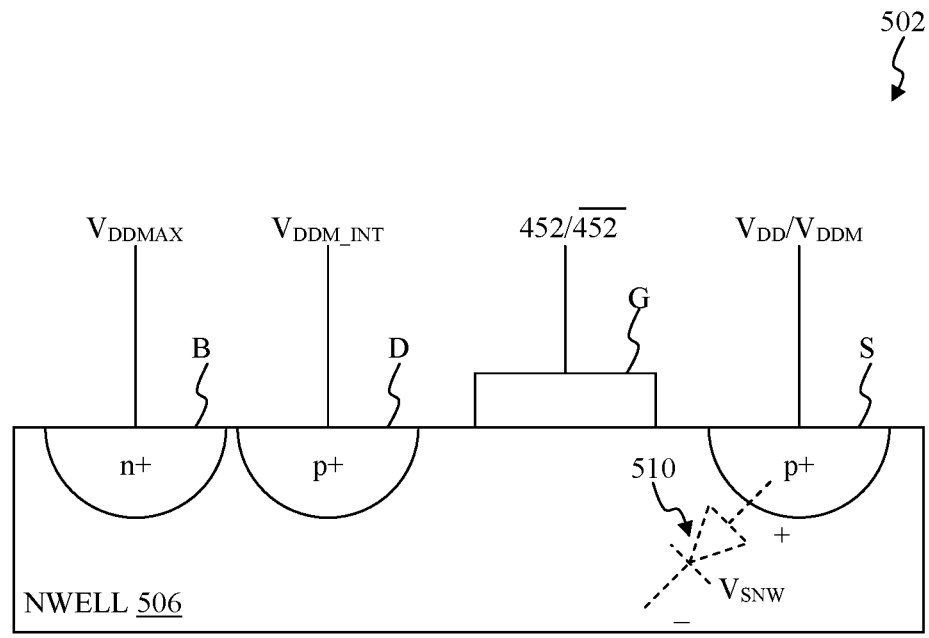
FIG. 5 graphically illustrates cross-sectional views of p-type metal-oxide-semiconductor (PMOS) transistors that can be implemented within the exemplary selection circuitry according to an exemplary embodiment of the present disclosure.
Figure 5:
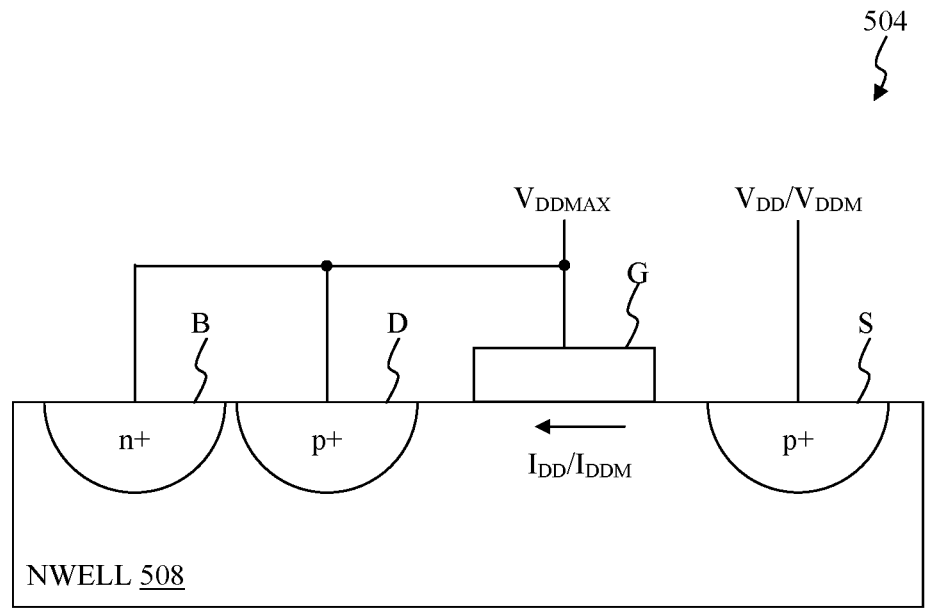

FIG. 5 graphically illustrates cross-sectional views of p-type metal-oxide-semiconductor (PMOS) transistors that can be implemented within the exemplary selection circuitry according to an exemplary embodiment of the present disclosure. More specifically, FIG. 5 graphically illustrates a first cross-sectional view of a first PMOS transistor 502 having a bulk (B) terminal, a drain (D) terminal, a gate (G) terminal, and a source (G) terminal and a second cross-sectional view of a second PMOS transistor 504 having a bulk (B) terminal, a drain (D) terminal, a gate (G) terminal, and a source (G) terminal. As illustrated in FIG. 5, the first PMOS transistor 502 and the second PMOS transistor 504 are formed within a first n-well region 506 and a second n-well region 508, respectively. The first PMOS transistor 502 can represent an exemplary embodiment of the PMOS transistor P4 or the PMOS transistor P5 as described above in FIG. 4 when the source S is coupled to VDD or VDDM respectively. Further, the second PMOS transistor 504 can represent an exemplary embodiment of the PMOS transistor P6 or the PMOS transistor P7 as described above in FIG. 4 when the source S is coupled to VDD or VDDM respectively.

In the exemplary embodiment illustrated in FIG. 5, the bulk (B) terminal of the first PMOS transistor 502 is electrically coupled to the maximum operational voltage signal $V_{DDMAX}$, the drain (D) terminal of the first PMOS transistor 502 is electrically coupled to the operational voltage signal $V_{DDM\_INT}$, the gate (G) terminal of the first PMOS transistor 502 is electrically coupled to the biasing control signal 452 or the biasing control signal $\overline{452}$, and the source (S) terminal of the first PMOS transistor 502 is electrically coupled to the operational voltage signal $V_{DDM}$ or the operational voltage signal $V_{DD}$ as described above in FIG. 4. As illustrated in FIG. 5, the bulk (B) terminal of the second PMOS transistor 504, the drain (D) terminal of the second PMOS transistor 504, and the gate (G) terminal of the second PMOS transistor 504 are electrically coupled to the maximum operational voltage signal $V_{DDMAX}$ and the source (S) terminal of the second PMOS transistor 504 is electrically coupled to the operational voltage signal $V_{DDM}$ or the operational voltage signal $V_{DD}$ as described above in FIG. 4. Moreover, as illustrated in FIG. 5, the first PMOS transistor 502 includes a parasitic P-N junction diode 510 situated between the source (S) terminal of the first PMOS transistor 502 and the first n-well region 506.

In the exemplary embodiment illustrated in FIG. 5, latch-up of the first PMOS transistor 502 can occur when a voltage between the source (S) terminal of the first PMOS transistor 502 and the first n-well region 506, denoted as voltage $V_{SNW}$ in FIG. 5, is greater than a threshold voltage VtPN of the parasitic P-N junction diode 510. The parasitic P-N junction diode 510 activates when the voltage $V_{SNW}$ is greater than the threshold voltage VtPN of the parasitic P-N junction diode 510 causing the latch-up of the first PMOS transistor 502. However, as to be described in further detail below, the second PMOS transistor 504 activates before the parasitic P-N junction diode 510 to effectively increase the maximum operational voltage signal $V_{DDMAX}$, which effectively lessens the voltage $V_{SNW}$. This lessening of the voltage $V_{SNW}$ prevents the parasitic P-N junction diode 510 from activating to effectively prevent latch-up of the first PMOS transistor 502.

As described above in FIG. 4, the maximum operational voltage signal $V_{DDMAX}$ can fluctuate to be less than the operational voltage signals $V_{DDM}$ and $V_{DD}$. In the exemplary embodiment illustrated in FIG. 5, the second PMOS transistor 504 activates when an absolute difference, representing an absolute value of the difference, between the operational voltage signal $V_{DDM}$ or the operational voltage signal $V_{DDM}$ and the maximum operational voltage signal $V_{DDMAX}$, namely, a gate to source voltage ($V_{GS}$) of the second PMOS transistor 504, is greater than a threshold voltage Vt504 of the second PMOS transistor 504. In an exemplary embodiment, the threshold voltage Vt504 of the second PMOS transistor 504, for example, approximately 0.2 V, is less than the threshold voltage VtPN of the parasitic P-N junction diode 510 for example, approximately 0.7 V. The second PMOS transistor 504, when activated, namely, closed, sources the current $I_{DD}$ or the current $I_{DDM}$ from the source (S) terminal of the second PMOS transistor 504 to the drain (D) terminal of the second PMOS transistor 504 to effectively increase the maximum operational voltage signal $V_{DDMAX}$. This increase in the maximum operational voltage signal $V_{DDMAX}$ causes a similar increase in voltage of the first n-well region 506 to effectively decease the voltage $V_{SNW}$ to prevent the parasitic P-N junction diode 510 from activating and, hence, latch-up of the first PMOS transistor 502. In some embodiments, transistor 504 is designed such that its threshold voltage Vt504 is as less as possible compared with the threshold voltage VtPN of the P-N junction diode 510. As a result, the chance for transistor 504 to be turned on while the P-N junction diode 510 is still off is increased, and the chance for latch-up as described above is decreased.

Exemplary Operation of the Exemplary Memory Storage System

Figure 6:
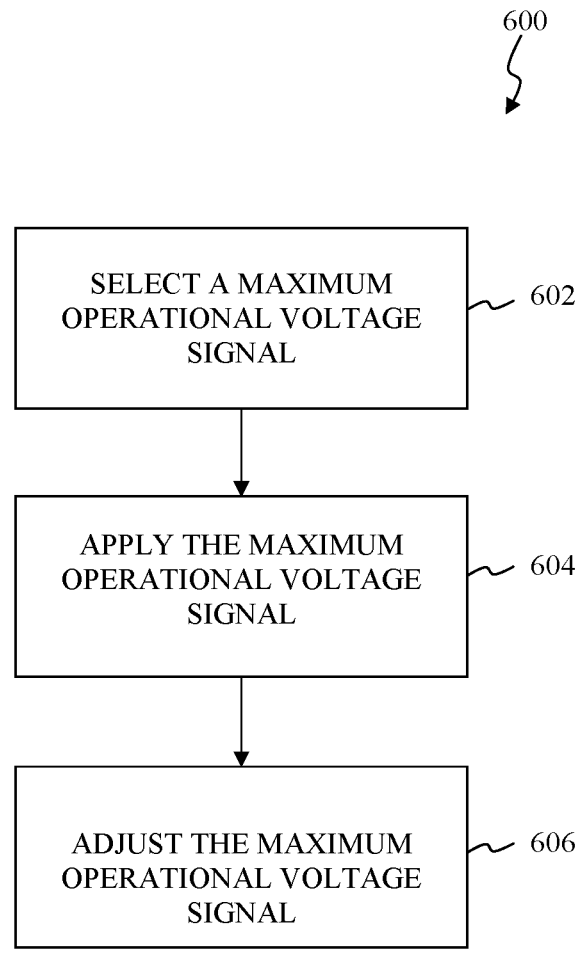
FIG. 6 illustrates a flowchart of an exemplary operation of the exemplary memory storage system according to an exemplary embodiment of the present disclosure.

FIG. 6 illustrates a flowchart of an exemplary operation of the exemplary memory storage system according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes exemplary operational flow 600 of a memory storage system, such as the memory storage system 100 or the memory storage system 600 to provide an example.

At operation 602, the exemplary operational flow 600 selects a maximum operational voltage signal from among multiple operational voltage signals. In an exemplary embodiment, the operation 602 can be performed by the voltage generator circuitry 102 as described above in FIG. 1.

At operation 604, the exemplary operational flow 600 applies the maximum operational voltage signal, such as the maximum operational voltage signal $V_{DDMAX}$ as described above, to at least one bulk (B) terminal of at least one transistor of the memory storage system, such as the PMOS transistors P4, P5, P6 and P7 as described above in FIG. 4, and/or to at least one gate (G) terminal of at least one transistor of the memory storage system, such as the PMOS transistors P6 and P7 as described above in FIG. 4. In an exemplary embodiment, the operation 604 can be performed by the selection circuitry 104.1 through 104.*x* as described above in FIG. 1, the selection circuitry 200.1 through 200.*m* as described above in FIG. 2A, the selection circuitry 220.1 through 200.*n* as described above in FIG. 2B, and/or the selection circuitry 400 as described above in FIG. 4.

At operation 606, the exemplary operational flow 600 adjusts, for example, increases, the maximum operational voltage signal when the maximum operational voltage signal fluctuates below a first operational voltage signal from the multiple operational voltage signals. In an exemplary embodiment, the operation 604 can be performed by the selection circuitry 104.1 through 104.*x* as described above in FIG. 1, the selection circuitry 200.1 through 200.*m* as described above in FIG. 2A, the selection circuitry 220.1 through 200.*n* as described above in FIG. 2B, and/or the selection circuitry 400 as described above in FIG. 4. In some situations, the maximum operational voltage signal can fluctuate. These fluctuations can be caused by unwanted electromagnetic coupling and/or leakage between various regions of various transistors of the memory storage system. The exemplary operational flow 600 can cause a current to be sourced from the first operational voltage signal to increase the maximum operational voltage signal when the maximum operational voltage signal fluctuates below the first operational voltage signal.

CONCLUSION

The foregoing Detailed Description discloses selection circuitry for selectively providing an operational voltage signal to a memory storage system. The selection circuitry includes a switching circuit and a latch-up prevention circuit. The switching circuit, having transistors, selects the operational voltage signal from among operational voltage signals. A maximum operational voltage signal from among the operational voltage signals is selectively applied to bulk terminals of the transistors. The latch-up prevention circuit dynamically adjusts the maximum operational voltage signal to compensate for fluctuations in the maximum operational voltage signal.

The foregoing Detailed Description also discloses latch-up prevention circuitry for a memory storage system. The latch-up prevention circuitry includes a first diode connected transistor and a second diode connected transistor to apply a maximum operational voltage signal selected from among multiple operational voltage signals to a first bulk terminal of the first diode connected transistor and a second bulk terminal of the second diode connected transistor. The first diode connected transistor and the second diode connected transistor are coupled to a second operational voltage signal and a third operational voltage signal, respectively, from among the multiple operational voltage signals. The first diode connected transistor is sources a first current from the second operational voltage signal when activated to adjust the maximum operational voltage signal to compensate for fluctuations in the maximum operational voltage signal. The second diode connected transistor sources a second current from the third operational voltage signal when activated to adjust the maximum operational voltage signal to compensate for the fluctuations in the maximum operational voltage signal.

The foregoing Detailed Description further discloses a method for preventing latch-up of a memory storage system. The method includes applying a first operational voltage signal selected from among multiple operational voltage signals to at least one bulk region of at least one transistor of the memory storage system, at least one gate region of the at least one transistor, and at least one drain region of the at least one transistor, applying a second operational voltage signal selected from among the multiple operational voltage signals to at least one source region of the at least one transistor, and increasing the first operational voltage signal when an absolute difference between the first operational voltage signal and the second operational voltage signal is greater than a threshold voltage of the at least one transistor.

The foregoing Detailed Description referred to accompanying figures to illustrate exemplary embodiments consistent with the disclosure. References in the foregoing Detailed Description to "an exemplary embodiment" indicates that the exemplary embodiment described can include a particular feature, structure, or characteristic, but every exemplary embodiment may not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The foregoing Detailed Description is not meant to limiting. Rather, the scope of the disclosure is defined only in accordance with the following claims and their equivalents. It is to be appreciated that the foregoing Detailed Description, and not the following Abstract section, is intended to be used to interpret the claims. The Abstract section can set forth one or more, but not all exemplary embodiments, of the disclosure, and thus, is not intended to limit the disclosure and the following claims and their equivalents in any way.

The exemplary embodiments described within foregoing Detailed Description have been provided for illustrative purposes and are not intended to be limiting. Other exemplary embodiments are possible, and modifications can be made to the exemplary embodiments while remaining within the spirit and scope of the disclosure. The foregoing Detailed Description has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

Embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing circuitry). For example, a machine-readable medium can include non-transitory machine-readable mediums such as read only memory (ROM); random-access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

The foregoing Detailed Description fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. Latch-up prevention circuitry for a memory storage system, the latch-up prevention circuitry comprising:
   a first transistor and a second transistor configured to apply a first operational voltage signal selected from among a plurality of operational voltage signals to a first bulk terminal of the first transistor and a second bulk terminal of the second transistor, respectively,
   wherein the first transistor and the second transistor are coupled to a second operational voltage signal and a third operational voltage signal, respectively, from among the plurality of operational voltage signals,
   wherein the first transistor is further configured to source a first current from the second operational voltage signal when activated to adjust the first operational voltage signal to compensate for fluctuations in the first operational voltage signal, and
   wherein the second transistor is further configured to source a second current from the third operational voltage signal when activated to adjust the first operational voltage signal to compensate for the fluctuations in the first operational voltage signal.

2. The latch-up prevention circuitry of claim 1, wherein the first transistor is configured to be activated in response to the first operational voltage signal being less than the second operational voltage signal by at least a first threshold voltage of the first transistor, and
   wherein the second transistor is configured to be activated in response to the first operational voltage signal being less than the third operational voltage signal by at least a second threshold voltage of the second transistor.

3. The latch-up prevention circuitry of claim 2, wherein the first transistor, when activated, is configured to source the first current from a first source region to a first drain region to increase the first operational voltage signal, and
   wherein the second transistor, when activated, is configured to source the second current from a second source region to a second drain region to increase the first operational voltage signal.

4. The latch-up prevention circuitry of claim 3, wherein the first operational voltage signal, when increased, is configured to decrease a voltage across a first parasitic diode situated between the first source region and a first well region of the first transistor, and
   wherein the first operational voltage signal, when increased, is further configured to decrease a voltage across a second parasitic diode situated between the second source region and a second well region of the second transistor.

5. The latch-up prevention circuitry of claim 1, wherein the first operational voltage comprises:
   a maximum operational voltage signal from among the plurality of operational voltage signals.

6. The latch-up prevention circuitry of claim 1, wherein the first transistor and the second transistor comprise:
   a first diode connected transistor and a second diode connected transistor, respectively.

7. The latch-up prevention circuitry of claim 6, wherein the diode connected transistors comprise:
   a first p-type metal-oxide-semiconductor (PMOS) diode connected transistor and a second PMOS diode connected transistor, respectively.

8. A method for preventing latch-up of a memory storage system, the method comprising:
   applying, by the memory storage system, a first operational voltage signal selected from among a plurality of operational voltage signals to a first bulk terminal of a first diode connected transistor and a second bulk terminal of a second diode connected transistor;
   sourcing, by the memory storage system, a first current from a second operational voltage signal from among the plurality of operational voltage signals by activating the first diode connected transistor to adjust the first operational voltage signal to compensate for fluctuations in the first operational voltage signal; and
   sourcing, by the memory storage system, a second current from a third operational voltage signal by activating the second diode connected transistor to adjust the first operational voltage signal to compensate for the fluctuations in the first operational voltage signal.

9. The method of claim 8, wherein the sourcing the first current comprises:
   activating the first diode connected transistor in response to the first operational voltage signal being less than the second operational voltage signal by at least a first threshold voltage of the first diode connected transistor; and
   wherein the sourcing the second current comprises:
   activating the second diode connected transistor in response to the first operational voltage signal being less than the third operational voltage signal by at least a second threshold voltage of the second diode connected transistor.

10. The method of claim 9, wherein the sourcing the first current further comprises:
    sourcing, by the first diode connected transistor when activated, the first current from a first source region to a first drain region to increase the first operational voltage signal, and
    wherein the sourcing the second current further comprises:
    sourcing, by the second diode connected transistor when activated, the second current from a second source region to a second drain region to increase the first operational voltage signal.

11. The method of claim 10, wherein the sourcing the first current from the first source region comprises:
    sourcing, by the first diode connected transistor when activated, the first current from the first source region to the first drain region to increase the first operational voltage signal to decrease a first voltage across a first parasitic diode situated between the first source region and a first well region of the first diode connected transistor to be less than a threshold voltage of the first parasitic diode, and
    wherein the sourcing the second current from the second source region comprises:

sourcing, by the second diode connected transistor when activated, the second current from the second source region to the first second region to increase the first operational voltage signal to decrease a second voltage across a second parasitic diode situated between the second source region and a second well region of the second diode connected transistor to be less than a threshold voltage of the second parasitic diode.

12. The method of claim 8, wherein the first operational voltage comprises:

a maximum operational voltage signal from among the plurality of operational voltage signals.

13. The method of claim 8, wherein the first diode connected transistor and the second diode connected transistor comprise:

p-type metal-oxide-semiconductor (PMOS) diode connected transistors.

* * * * *